(12) United States Patent
Lee

(10) Patent No.: US 8,709,931 B2
(45) Date of Patent: Apr. 29, 2014

(54) FUSE PART IN SEMICONDUCTOR DEVICE AND METHOD FOR FORMING THE SAME

(75) Inventor: Byung-Duk Lee, Icheon-si (KR)

(73) Assignee: SK Hynix Semiconductor, Inc., Icheon-si, Gyeonggi-do (KR)

( * ) Notice: Subject to any disclaimer, the term of this patent is extended or adjusted under 35 U.S.C. 154(b) by 319 days.

(21) Appl. No.: 13/325,851

(22) Filed: Dec. 14, 2011

(65) Prior Publication Data

US 2012/0088361 A1    Apr. 12, 2012

Related U.S. Application Data

(62) Division of application No. 12/344,174, filed on Dec. 24, 2008, now Pat. No. 8,097,931.

(30) Foreign Application Priority Data

Apr. 1, 2008  (KR) .................. 10-2008-0030268

(51) Int. Cl.
    *H01L 21/44*    (2006.01)
(52) U.S. Cl.
    USPC .............. 438/601; 438/600; 257/E21.592
(58) Field of Classification Search
    CPC ............... H01L 27/11206; H01L 23/5252; H01L 23/5254; H01L 23/5256; H01L 23/5258
    USPC .......... 438/600, 601; 257/209, E21.592, 257/E21.595, E21.596
    See application file for complete search history.

(56) References Cited

U.S. PATENT DOCUMENTS

| | | | | |
|---|---|---|---|---|
| 5,755,570 A * | 5/1998 | Shinde et al. | ................. | 432/253 |
| 5,789,795 A * | 8/1998 | Sanchez et al. | ................. | 257/530 |
| 6,288,437 B1 * | 9/2001 | Forbes et al. | ................. | 257/530 |
| 6,861,727 B2 * | 3/2005 | Forbes et al. | ................. | 257/530 |
| 7,470,929 B2 * | 12/2008 | Hsu et al. | ................. | 257/50 |
| 7,911,025 B2 * | 3/2011 | Hsu et al. | ................. | 257/530 |
| 2008/0017858 A1 | 1/2008 | Hsu et al. | | |
| 2008/0224261 A1 * | 9/2008 | Hsu et al. | ................. | 257/530 |

FOREIGN PATENT DOCUMENTS

| | | |
|---|---|---|
| KR | 1020000001362 | 1/2000 |
| KR | 1020020066050 | 8/2002 |
| KR | 1020070076282 | 7/2007 |

OTHER PUBLICATIONS

Korean Notice of Allowance for 10-2008-0030268 dated Dec. 19, 2011.
Korean Office Action for application No. 10-2008-0030268.

* cited by examiner

*Primary Examiner* — Jarrett Stark
(74) *Attorney, Agent, or Firm* — Lowe Hauptman & Ham LLP

(57) ABSTRACT

A fuse part in a semiconductor device has a plurality of fuse lines extended along a first direction with a given width along a second direction. The fuse part includes a first conductive pattern having a space part formed in a fuse line region over a substrate, wherein portions of the first conductive pattern are spaced apart by the space part along the first direction. The fuse part includes a first insulation pattern formed over the space part, the first insulation pattern having a width smaller than a width of the first conductive pattern along the second direction and a thickness greater than a thickness of the first conductive pattern, and a second conductive pattern formed over the first insulation pattern, the second conductive pattern having a width greater than the width of the first insulation pattern along the second direction.

12 Claims, 11 Drawing Sheets

A-A'

B-B'

A-A'

B-B'

A-A'

B-B'

A-A'

B-B'

C-C'

C-C'

C-C'

_US 8,709,931 B2_

FUSE PART IN SEMICONDUCTOR DEVICE AND METHOD FOR FORMING THE SAME

CROSS-REFERENCE TO RELATED APPLICATIONS

The present application is a Divisional Application of U.S. patent application Ser. No. 12/344,174, filed Dec. 24, 2008, which claims priority of Korean patent application number 10-2008-0030268, filed on Apr. 1, 2008, which is incorporated herein by reference in its entirety.

BACKGROUND

When a semiconductor memory device is fabricated, one defective cell out of numerous micro cells results in the semiconductor memory device being discarded as an inferior device because the semiconductor memory device will not be able to execute a sufficient level of performance as a memory. However, it is very inefficient yield-wise to discard the entire device for having few defective cells in the memory. Thus, redundancy cells, which are installed beforehand in the memory, are currently being used to perform a repair process for replacing the defective cells. In this way, yield is improved because the entire memory is resuscitated. The semiconductor memory device includes a fuse part which stores address information of defective cells in accordance with the connecting state of a fuse to perform the repair process.

FIG. 1A illustrates a plan view of a fuse part in a typical semiconductor device. FIG. 1B illustrates a cross-sectional view taken along a line A-A' of the semiconductor device shown in FIG. 1A.

Referring to FIGS. 1A and 1B, a plurality of fuse lines 11 are formed over a semi-finished substrate 10. The fuse lines 11 are formed using one of existing circuit lines, e.g., plate lines and metal lines, in the fuse part rather than using additional lines.

An insulation layer 12 is formed over the fuse lines 11. The insulation layer 12 includes a fuse box 13 which represents a fuse open region. The fuse box 13 is formed by selectively etching the insulation layer 12. A portion of the insulation layer 12 remains to a certain thickness $R_{ox}$ over the fuse lines 11 after the fuse box 13 is formed.

According to the typical repairing method, a laser is applied to the fuse lines 11 through the fuse box 13 after forming the fuse part to cut the fuse lines 11. However, such repairing process shows the following limitations.

In order to successfully perform a fuse cutting process, the thickness $R_{ox}$ of the remaining insulation layer over the fuse lines has to be within appropriate range of values. However, the fuse cutting process often fails because it is difficult to control the thickness $R_{ox}$ due to the large differences in the thickness of the remaining insulation layer over the fuse lines formed over the wafer. Also, remnants are often generated after the fuse cutting process, causing limitations. Furthermore, damages may occur in fuse lines adjacent to the fuse lines being cut.

SUMMARY

Embodiments of a fuse part in a semiconductor device and a method for forming the same improve the reliability and yield of the device by using melted metal for fuse coupling instead of a typical fuse cutting method during a repair process.

In accordance with an aspect of a fuse part in a semiconductor device, a plurality of fuse lines extends along a first direction with a given width along a second direction. The fuse part includes: a first conductive pattern having a space part formed in a fuse line region over a substrate, wherein portions of the first conductive pattern are spaced apart by the space part along the first direction; a first insulation pattern formed over the space part, the first insulation pattern having a width smaller than a width of the first conductive pattern along the second direction and a thickness greater than a thickness of the first conductive pattern; and a second conductive pattern formed over the first insulation pattern, the second conductive pattern having a width greater than the width of the first insulation pattern along the second direction.

In accordance with another aspect, a method for forming a fuse part in a semiconductor device, the fuse part having a plurality of fuse lines extended along a first direction with a given width along a second direction, includes: forming a first conductive pattern having a space part in a fuse line region over a substrate, wherein portions of the first conductive pattern are spaced apart by the space part along the first direction; forming an inter-layer insulation layer over the resultant structure; etching the inter-layer insulation layer using a mask pattern to expose the space part, the mask pattern having openings with a width smaller than a width of the space part along the second direction; burying an insulation layer over the etched region of the inter-layer insulation layer to form a first insulation pattern; forming a second conductive pattern over the first insulation pattern and the inter-layer insulation layer, the second conductive pattern covering the space part; and removing remaining portions of the inter-layer insulation layer.

DESCRIPTION OF EMBODIMENTS

FIGS. 2A to 8B are plan and cross-sectional views of a fuse part in a semiconductor device to describe a method for forming the same in accordance with a first embodiment. FIGS. 2A, 3A, 4A, 5A, 6A, and 7A are plan views of the fuse part. FIGS. 2B, 3B, 4B, 5B, 6B, and 7B are cross-sectional views of the fuse part taken along a line A-A'. FIGS. 2C, 3C, 4C, 5C, 6C, and 7C are cross-sectional views of the fuse part taken along a line B-B'.

Hereafter, the direction along the length of fuse lines are referred to as a first direction and the direction intersecting the first direction along the width of the fuse lines is referred to as a second direction for convenience of description.

Figure 1A:
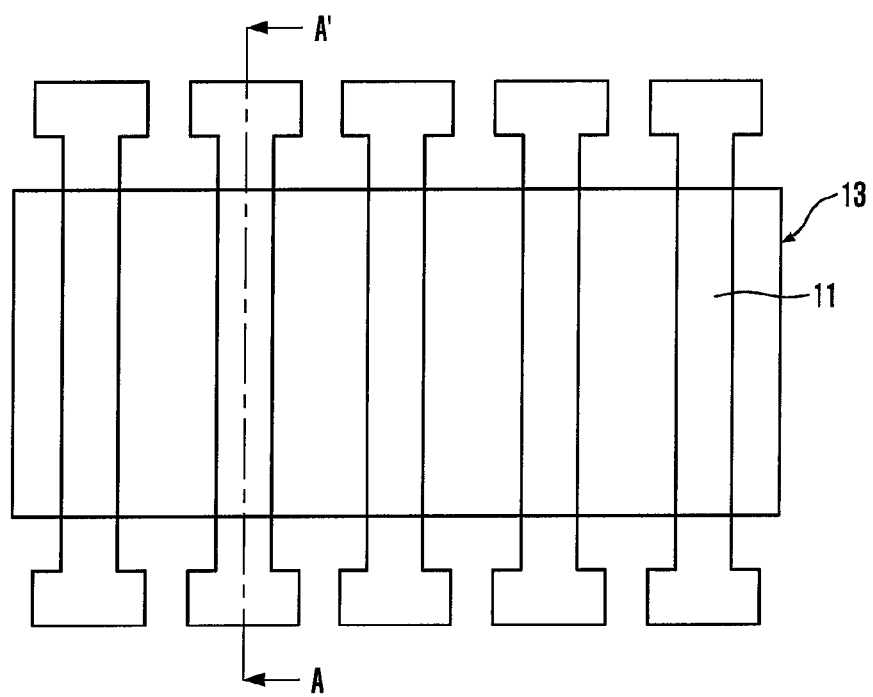
FIG. 1A illustrates a plan view of a fuse part in a typical semiconductor device.
Figure 1B:
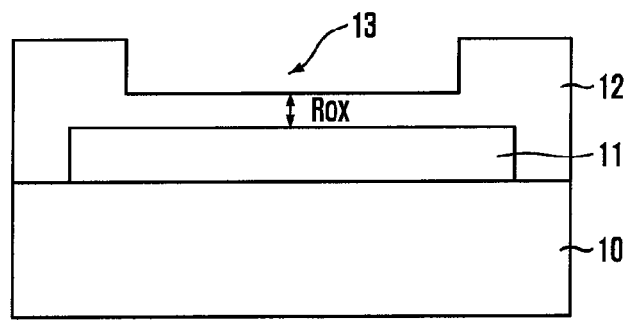
FIG. 1B illustrates a cross-sectional view taken along a line A-A' of the semiconductor device shown in FIG. 1A.
Figure 2A:
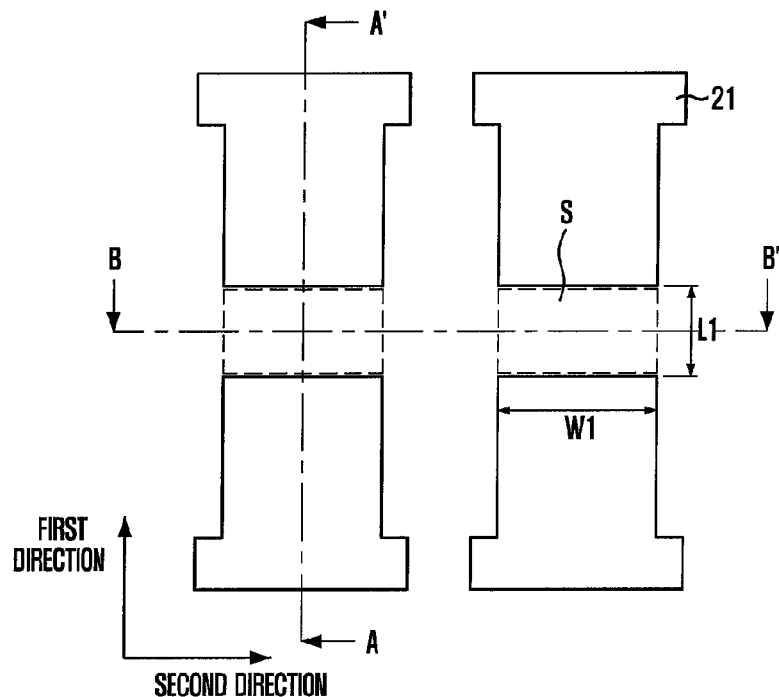
FIGS. 2A to 8B are plan and cross-sectional views of a fuse part in a semiconductor device to describe a method for forming the same in accordance with a first embodiment.
Figure 2B:
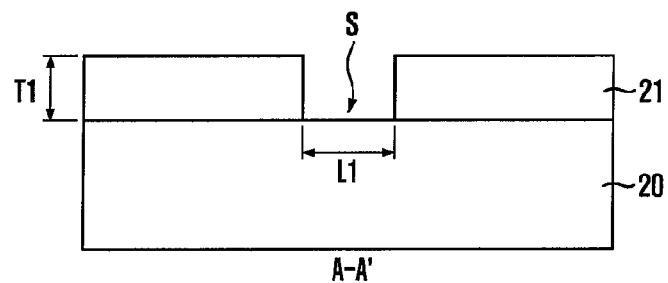
Figure 2C:
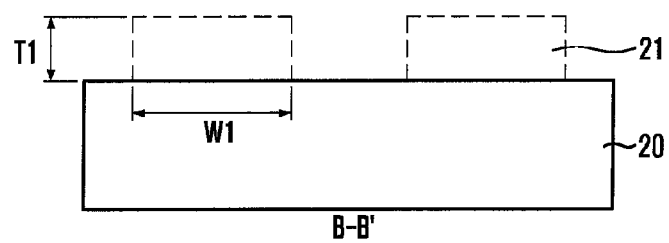

Referring to FIGS. 2A to 2C, fuse lines 21 are formed in regions predetermined for fuse lines over a semi-finished substrate 20. The fuse lines 21 are formed in a manner that a central portion of the fuse lines 21 is cut off along the first direction so that two portions of the fuse lines 21 are spaced out from each other. The portions where the fuse lines 21 are cut off, that is, the portions where the fuse lines 21 do not exist in the regions predetermined for the fuse lines, are referred to as space parts S for convenience of description. The width of the space parts S along the first direction is represented with reference denotation L1. The width of the space parts S along the second direction is represented with reference denotation W1. The width of the space parts S along the second direction is substantially the same as the width of the fuse lines 21. The thickness of the fuse lines 21 is represented with reference denotation T1. The fuse lines 21 may be formed using lower metal lines from multiple layers of metal lines.

Figure 3A:
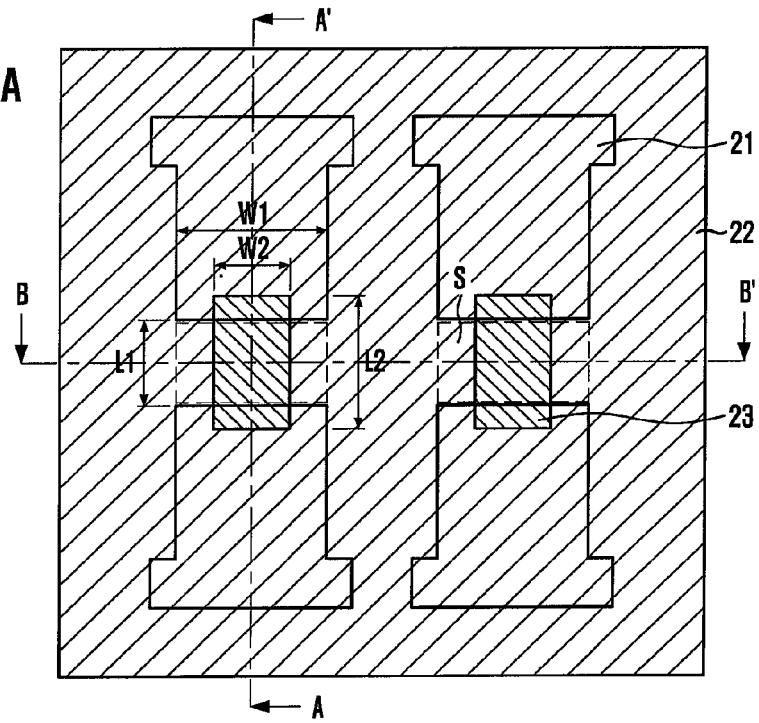
Figure 3B:
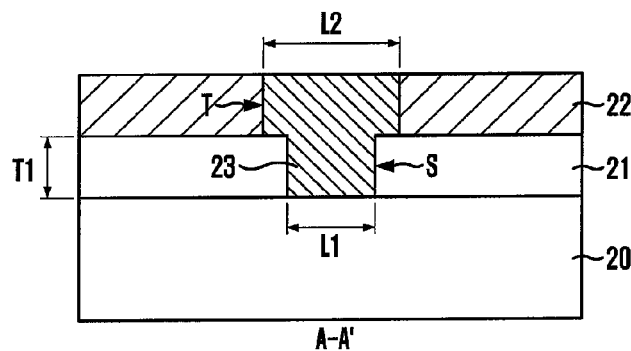
Figure 3C:
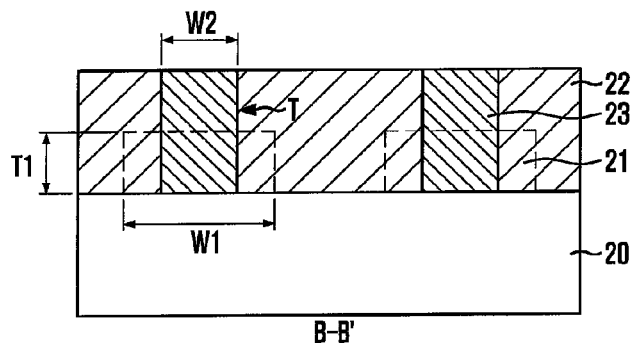

Referring to FIGS. 3A to 3C, an oxide-based layer is formed as an inter-layer insulation layer over the fuse lines 21. The oxide-based layer is formed to a thickness to sufficiently cover the fuse lines 21. For instance, in one embodiment, the oxide-based layer is formed to approximately 6,000 Å.

Although not illustrated, a photoresist pattern is formed over the oxide-based layer to form a subsequent nitride pattern. The photoresist pattern has openings which expose the space parts S. In some embodiments, the width of the openings along the second direction is smaller than W1 of the space parts S. The width of the openings along the first direction may be larger than L1 of the space parts S.

The oxide-based layer is etched using the photoresist pattern as an etch mask to form trenches T in the oxide-based layer and thereby forming an oxide-based pattern 22. A nitride-based layer is buried in the trenches T to form nitride-based patterns 23. Corresponding to the openings of the photoresist pattern, the width of the nitride-based patterns 23 along the second direction, represented with reference denotation W2, is smaller than W1 of the space parts S. Also, the width of the nitride-based patterns 23 along the first direction, represented with reference denotation L2, may be larger than L1 of the space parts S.

Figure 4A:
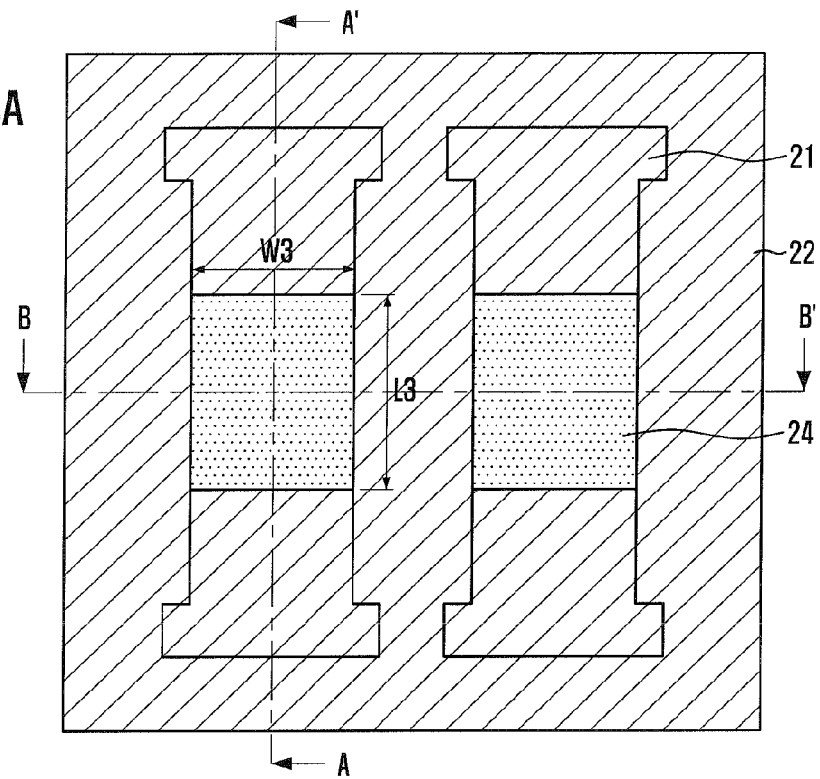
Figure 4B:
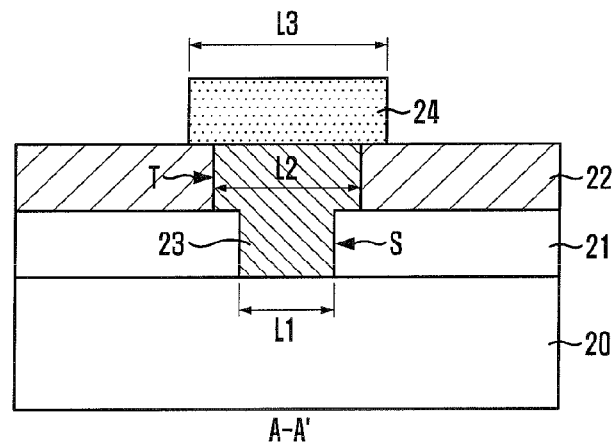
Figure 4C:
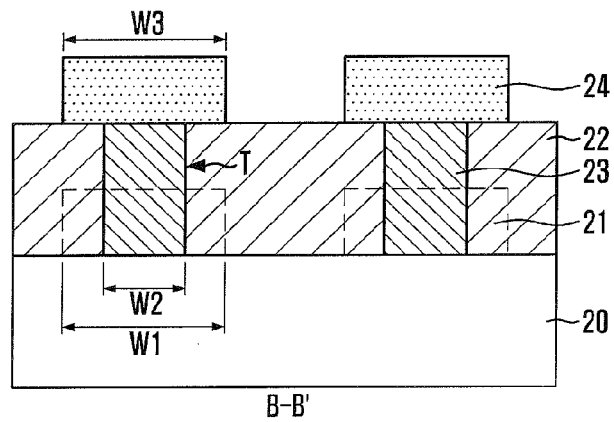

Referring to FIGS. 4A to 4C, metal patterns 24 are formed over the nitride-based patterns 23 and the oxide-based pattern 22 to cover the space parts S. The metal patterns 24 may be formed using upper metal lines rather than the metal lines forming the fuse lines 21 from multiple metal lines.

The width of the metal patterns 24 along the second direction as represented with reference denotation W3 are in some embodiments, larger than W2 of the nitride-based patterns 23. For instance, W3 of the metal patterns 24 may be substantially the same as W1 of the space parts S. Also, the width of the metal patterns 24, along the first direction as represented with reference denotation L3, may be larger than L1 of the space parts S.

Figure 5A:
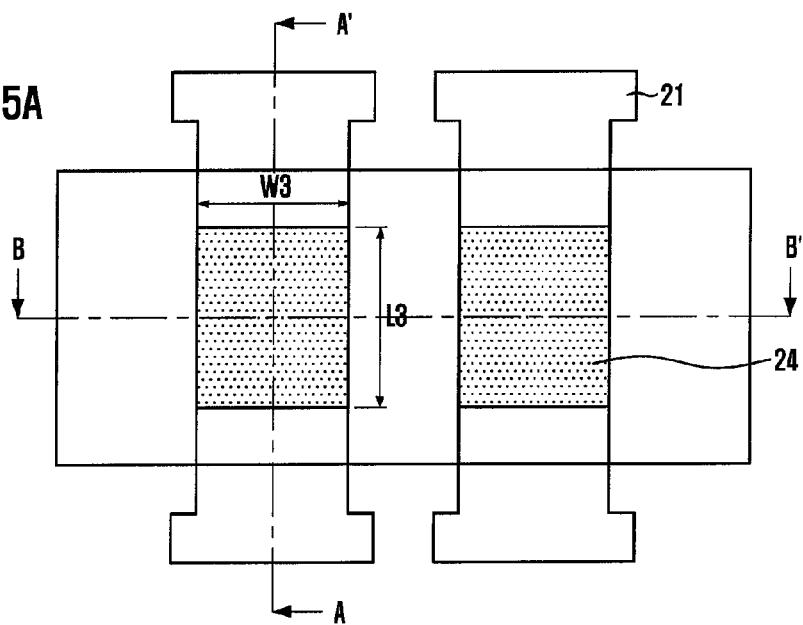
Figure 5B:
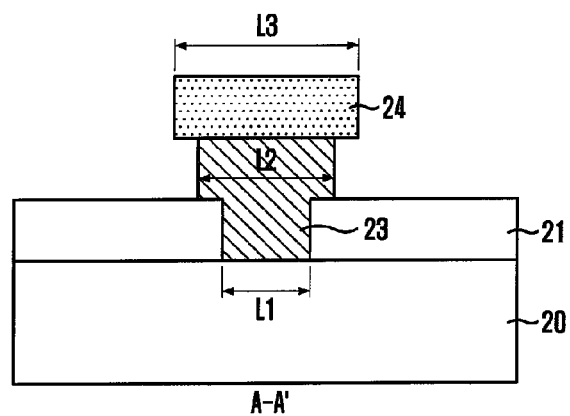
Figure 5C:
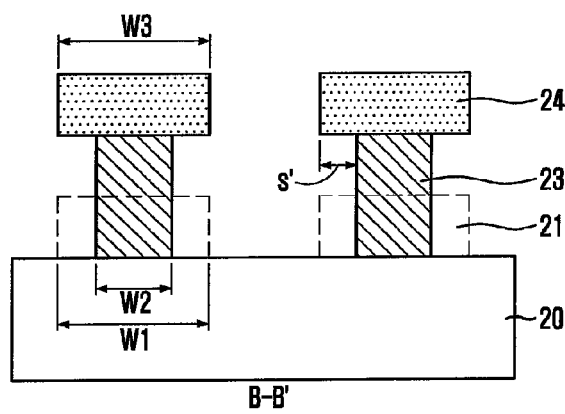

Referring to FIGS. 5A to 5C, a wet dip process is performed to remove exposed portions of the oxide-based pattern 22 using a mask which is the same as a mask for forming a subsequent fuse box.

As a result, structures including the fuse lines 21 spaced at the center, the nitride-based patterns 23 formed in the space parts S, having the second direction width W2 smaller than the second direction width W1 of the space parts S and a thickness larger than the thickness T1 of the fuse lines 21, and the metal patterns 24 formed over the nitride-based patterns 23, having the second direction width W3 larger than the second direction width W2 of the nitride-based patterns 23 are formed. Because the second direction width W3 of the metal patterns 24 is larger than the second direction width W2 of the nitride-based patterns 23, empty spaces S' (shown in FIG. 5C) are formed below the metal patterns 24 in such structures due to the width difference.

Figure 6A:
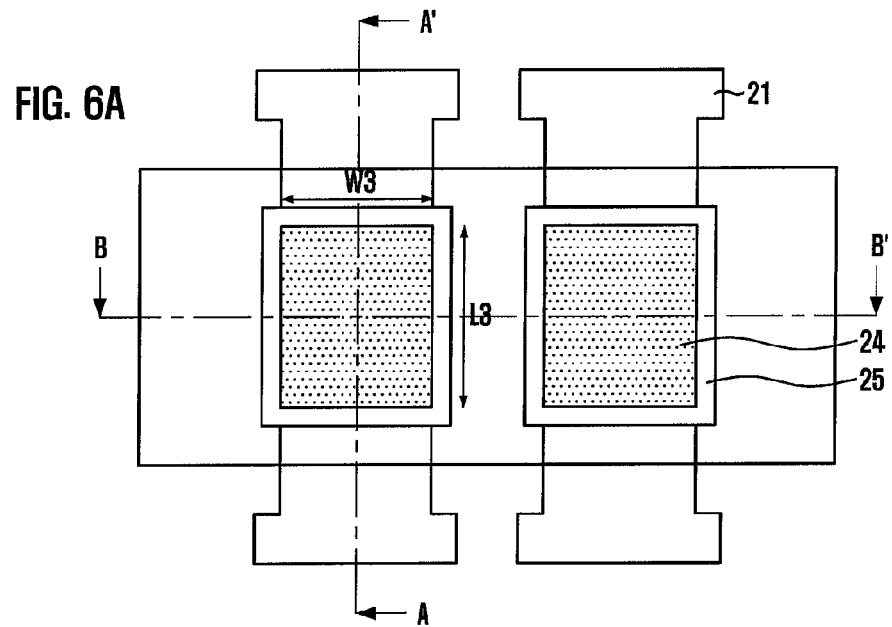
Figure 6B:
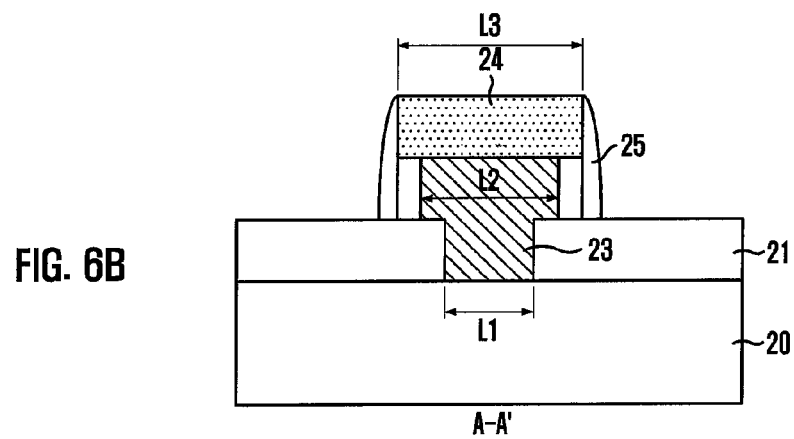
Figure 6C:
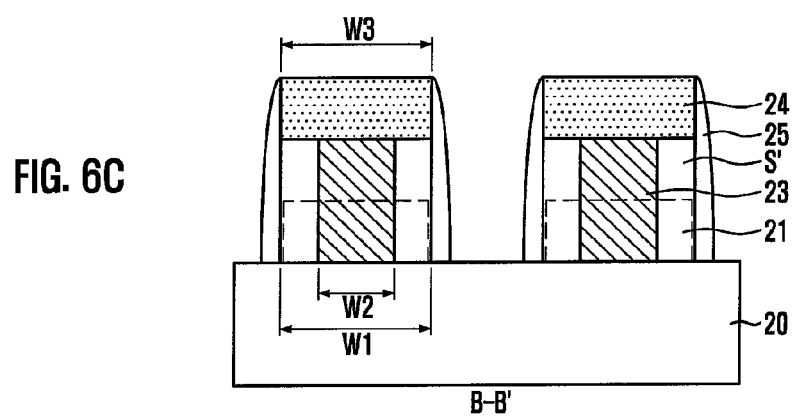

Referring to FIGS. 6A to 6C, a spacer nitride layer is formed over the resultant structure. A dry blanket etch process is performed on the spacer nitride layer to form nitride spacers 25 on sidewalls of the metal patterns 24 and regions below the metal patterns 24. The regions below the metal patterns 24 include the empty spaces S' formed by the width difference, i.e., the difference between W3 and W2. The empty spaces S' are maintained during the formation of the nitride spacers 25 due to the deposition characteristics of nitride. The nitride spacers 25 are formed to prevent the metal patterns 24 from affecting adjacent fuses when the metal patterns 24 melt during a subsequent repair process.

Figure 7A:
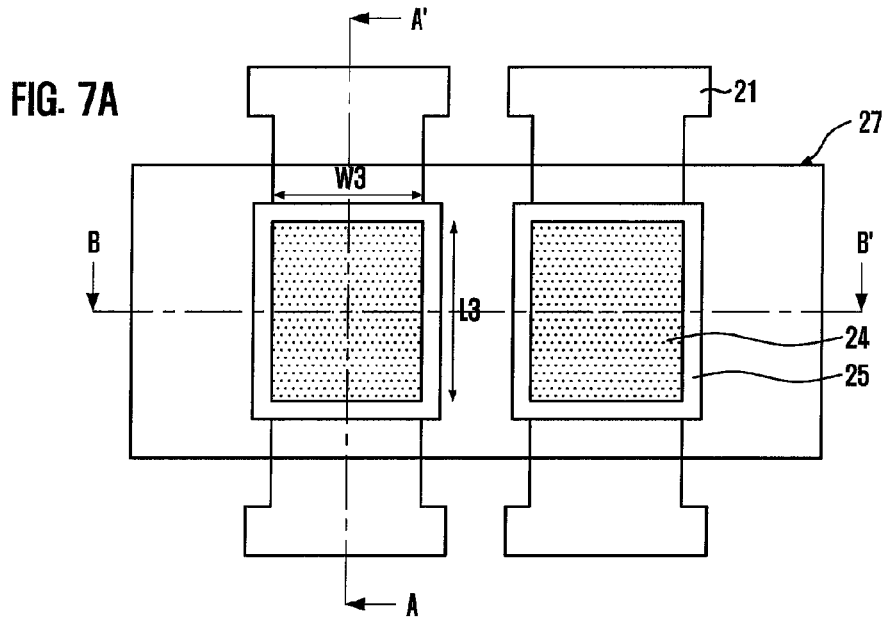
Figure 7B:
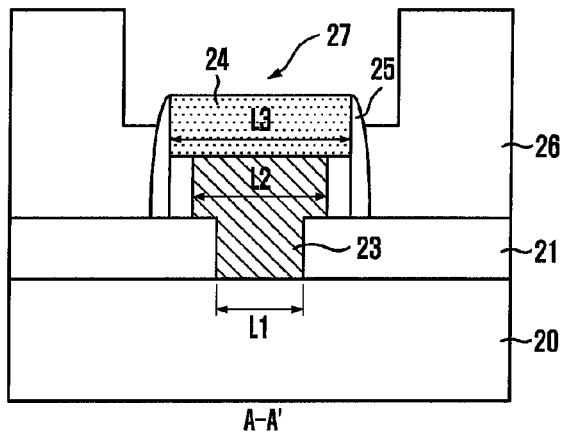
Figure 7C:
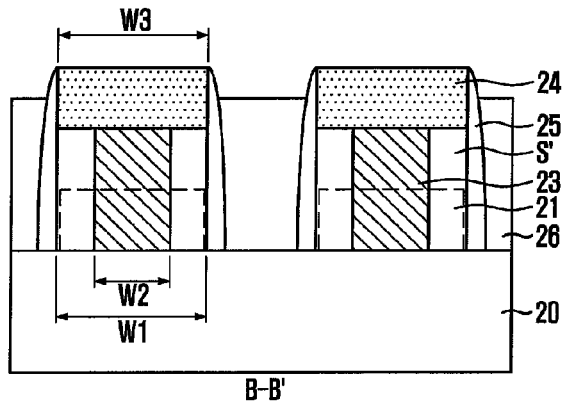

Referring to FIGS. 7A to 7C, an insulation layer is formed over the resultant structure including the nitride spacers 25. The insulation layer is selectively etched using a mask for forming a fuse box to form a fuse box 27. Reference numeral 26 refers to a patterned insulation layer 26. When etching the insulation layer to form the fuse box 27, the insulation layer is etched to a depth lower than the upper surface of the metal patterns 24 so that the upper surface of the metal patterns 24 are sufficiently exposed. Thus, a fuse part is formed in accordance with the first embodiment.

A method for repairing in the fuse part is described as follows.

Figure 8A:
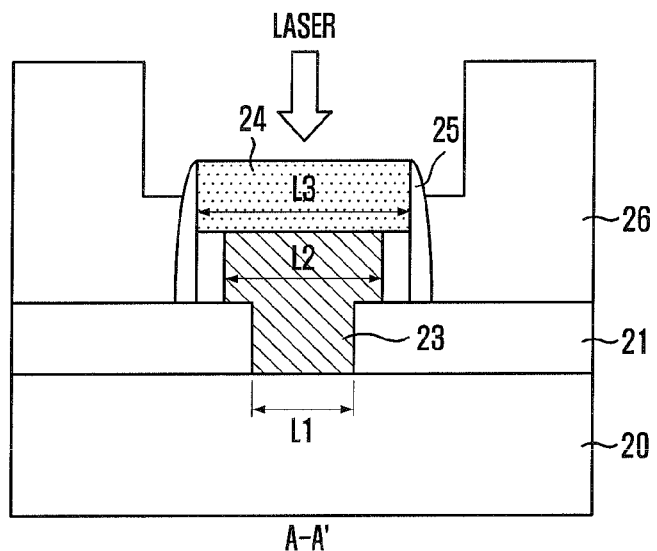

Referring to FIG. 8A, a laser is applied through the fuse box 27 to the metal pattern 24 formed over the desired fuse line 21 to be coupled. The laser is applied at a melting temperature for metal included in the metal pattern 24 so that the metal pattern 24 may melt.

Figure 8B:
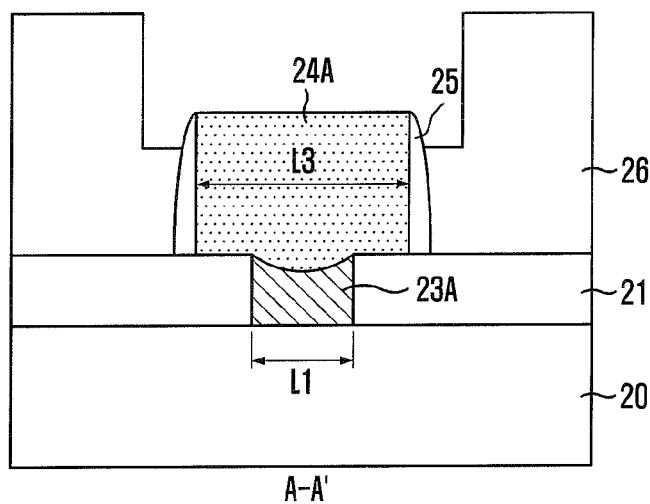

Referring to FIG. 8B, when the metal pattern 24 melts, the metal of the metal pattern 24 flows into the empty spaces S' which was formed by the width difference between the nitride-based pattern 23 and the metal pattern 24 along the second direction. Accordingly, the two spaced out portions of the fuse line 21 are mutually coupled by the melted metal of the metal pattern 24. Reference numerals 23A and 24A represent a remaining nitride-based pattern 23A and a melted metal pattern 24A.

Accordingly, limitations caused during a typical repair process using a fuse cutting method may not occur because the repair process is performed by coupling the divided fuse lines using melted metal.

In the fuse part structure described in the first embodiment of the present invention, the repair process may be performed with more ease by adjusting the shape of the fuse lines, the width of the nitride-based patterns along the first and second directions, the width of the metal patterns along the first and second directions, and the thickness of the nitride-based patterns. A method for forming a fuse part where the shape of fuse lines is altered is described as follows.

Figure 9A:
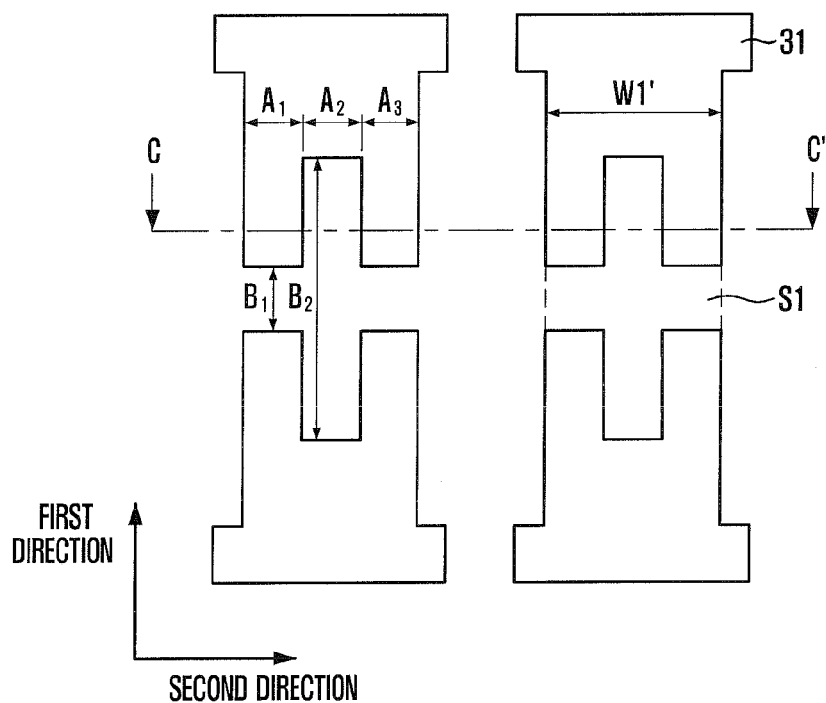
FIGS. 9A to 11B are plan and cross-sectional views of a fuse part in a semiconductor device to describe a method for forming the same in accordance with a second embodiment.
Figure 9B:
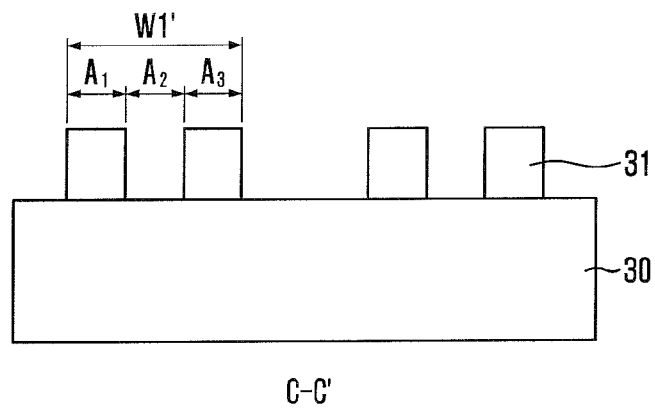
Figure 10A:
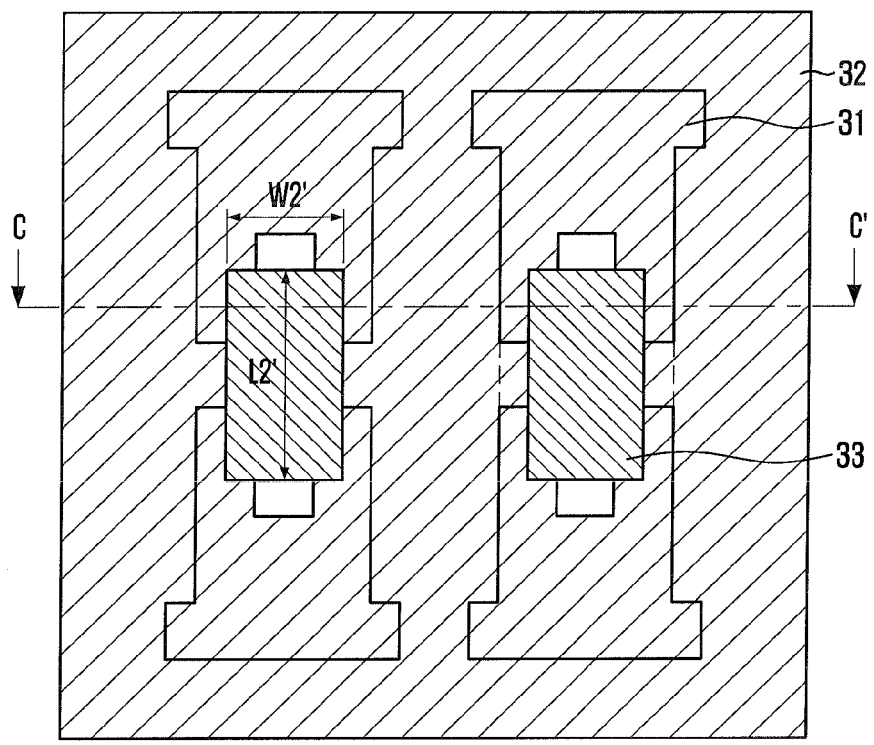
Figure 10B:
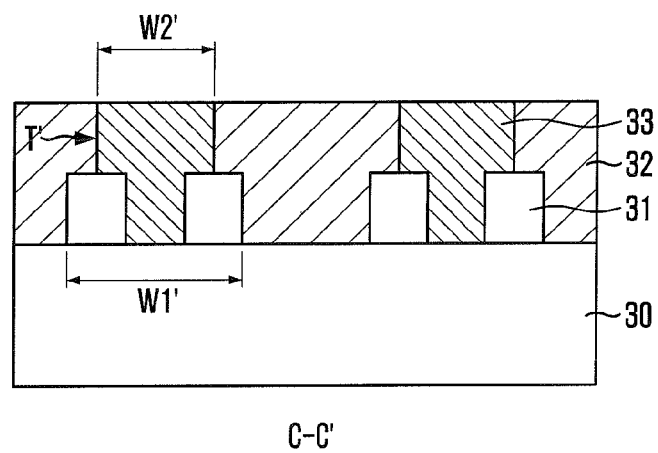
Figure 11A:
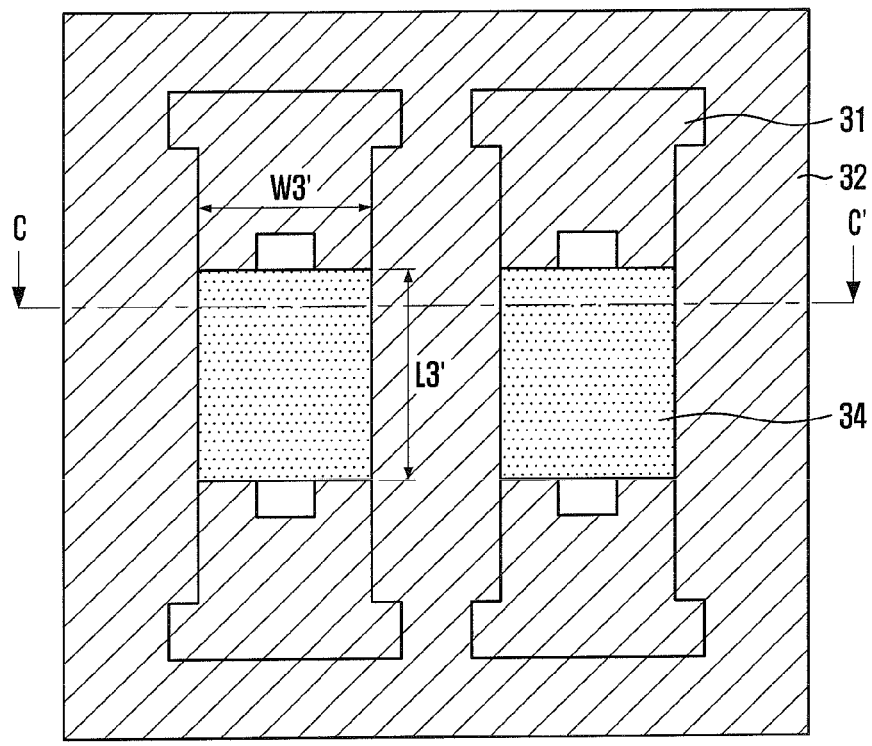
Figure 11B:
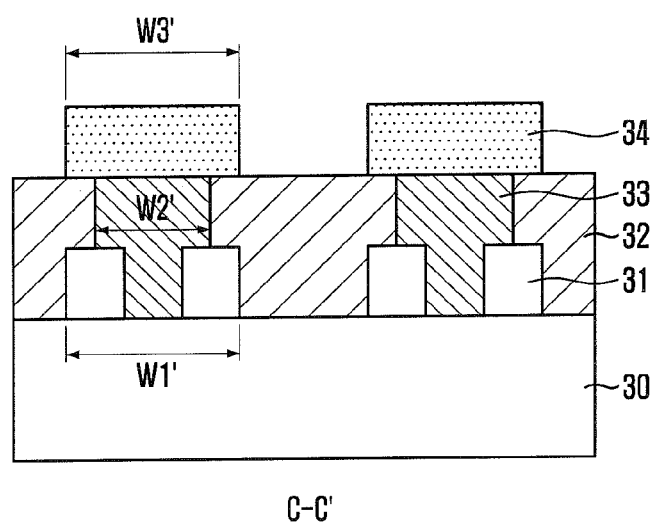

FIGS. 9A to 11B are plan and cross-sectional views of a fuse part in a semiconductor device to describe a method for forming the same in accordance with a second embodiment. FIGS. 9A, 10A, and 11A are plan views of the fuse part. FIGS. 9B, 10B, and 11B are cross-sectional views of the fuse part taken along a line C-C'. In this second embodiment, descriptions which overlap with FIGS. 2A to 7C in the first embodiment are omitted. The descriptions in the second embodiment focus on the difference with FIGS. 2A to 7C in the first embodiment.

Hereafter, the direction along the length of fuse lines are referred to as a first direction and the direction intersecting the first direction along the width of the fuse lines is referred to as a second direction for convenience of description.

Referring to FIGS. 9A and 9B, fuse lines 31 are formed in regions predetermined for fuse lines over a semi-finished substrate 30. The fuse lines 31 are formed in a manner that a central portion of the fuse lines 31 is cut off along the first direction so that two portions of the fuse lines 31 are spaced out from each other. This description is substantially the same as the description in the first embodiment. In the second embodiment, each cut and spaced apart portion of the fuse lines 31 is formed to have two isolated lines and a space between the two isolated lines along the second direction.

When forming the fuse lines 21 in the first embodiment, it may be difficult to mutually couple the spaced apart fuse line 21 during the laser application if the width of the space parts S is too large along the first direction. On the other hand, if the width of the space parts S is too small along the first direction, it may be difficult to secure a process margin during the subsequent processes, e.g., for forming the nitride-based patterns 23 and the metal patterns 24. Thus, it is more desirable to form the fuse lines 31 in the shape shown in the second embodiment.

Because the fuse lines 31 are formed in a shape different from that in the first embodiment, space parts S1 are formed in a cross shape rather than a quadrangular shape like that of the space parts S in the first embodiment.

Thus, the width of the space parts S1 along the first direction is not uniform as that of the space parts S in the first embodiment. The width of the space parts S1 along the first direction between the two cut lines of the fuse lines 31 is smaller and the width of the space parts S1 along the first direction at the space between the two lines is larger.

The width of the space parts S1 along the first direction between the two cut lines of the fuse lines 31 is referred to as a minimum first direction width B1 of the space parts S1. The width of the space parts S1 along the first direction at the space between the two lines of the fuse lines 31 is referred to as a maximum first direction width B2 of the space parts S1.

Reference denotation W1' represents the width of the fuse lines 31 along the second direction. Reference denotations A1 and A3 represent the width of each of the two cut lines of the fuse lines 31 along the second direction. Reference denotation A2 represents the width of the space between the two lines of the fuse lines 31 along the second direction.

For instance, when W1' of the fuse lines 31 is approximately 0.5 µm, A1 and A3 of the two lines of the fuse lines 31 are approximately 0.2 µm each and A2 of the space between the two lines is approximately 0.1 µm. That is, a ratio of A1:A2:A3 may be approximately 2:1:2.

Referring to FIGS. 10A and 10B, an oxide-based layer is formed over the resultant structure having the fuse lines 31. The oxide-based layer is formed to a thickness to sufficiently cover the fuse lines 31.

Although not illustrated, a photoresist pattern is formed over the oxide-based layer to form a subsequent nitride pattern. The details of the photoresist pattern are substantially the same as the description in the first embodiment. The photoresist pattern has quadrangular openings corresponding to portions where the space parts S1 are formed. In some embodiments, the width of the openings along the second direction is smaller than W1' of the fuse lines 31. Furthermore, in some embodiments, the width of the openings along the second direction must be smaller than W1' of the fuse lines 31. For instance, the width of the openings along the second direction is formed to a width that exposes a portion of each of the two lines of the fuse lines 31. The width of the openings along the first direction may be larger than the minimum first direction width B1 of the space parts S1 and smaller than the maximum first direction width B2 of the space parts S1.

The oxide-based layer is etched using the photoresist pattern as an etch mask to form trenches T' in the oxide-based layer and thereby forming an oxide-based pattern 32. A nitride-based layer is buried in the trenches T' to form nitride-based patterns 33. Corresponding to the openings of the photoresist pattern, the width of the nitride-based patterns 33 along the second direction, represented with reference denotation W2', is smaller than W1' of the fuse lines 31. For instance, W2' of the nitride-based patterns 33 is formed to a width that covers a portion of each of the two lines of the fuse lines 31. Also, the width of the nitride-based patterns 33 along the first direction, represented with reference denotation L2', may be larger than the minimum first direction width B1 of the space parts S1 and smaller than the maximum first direction width B2 of the space parts S1.

Referring to FIGS. 11A and 11B, metal patterns 34 are formed over the nitride-based patterns 33 and the oxide-based pattern 32 to cover the space parts S'.

The width of the metal patterns 34 along the second direction, represented with reference denotation W3', is, in some embodiments, larger than W2' of the nitride-based patterns 33, and in some embodiments must be larger than W2'. For instance, W3' has substantially the same width as W1' of the fuse lines 31. Also, the width of the metal patterns 34 along the first direction, represented with reference denotation L3', may be substantially the same as L2' of the nitride-based patterns 33.

Details of subsequent processes are substantially the same as that described in FIGS. 5A to 7C in the first embodiment. Thus, a fuse part is formed in accordance with the second embodiment. Furthermore, a method for repairing in this fuse part structure according to the second embodiment is substantially the same as that described in FIGS. 8A and 8B.

In other words, the fuse part in accordance with the second embodiment has a structure that allows an easier repair process because the cut ends of the fuse lines have two isolated lines, adjusting the width of the nitride-based patterns and the metal patterns.

Disclosed embodiments relate to a fuse part in a semiconductor device and a method for forming the same, wherein metal is melted to couple fuses, thus improving the reliability and yield of the device.

While specific embodiments have been described, it will be apparent to those skilled in the art that various changes and modifications may be made without departing from the spirit and scope of the following claims.

What is claimed is:

1. A method for forming a fuse part in a semiconductor device, the fuse part having a plurality of fuse lines extended along a first direction with a given width along a second direction, the method comprising:
    forming a first conductive pattern having a space part in a fuse line region over a substrate, wherein portions of the first conductive pattern are spaced apart by the space part along the first direction;
    forming an inter-layer insulation layer over first conductive pattern;
    etching the inter-layer insulation layer using a mask pattern to expose the space part, the mask pattern having openings with a width smaller than a width of the space part along the second direction;
    burying an insulation layer in the etched region of the inter-layer insulation layer to form a first insulation pattern;
    forming a second conductive pattern over the first insulation pattern and the inter-layer insulation layer, the second conductive pattern covering the space part; and
    removing remaining portions of the inter-layer insulation layer.

2. The method of claim 1, further comprising, after removing the remaining portions of the inter-layer insulation layer:
    forming a spacer material layer; and performing a dry blanket etch on the spacer material layer to form spacers over sidewalls of the second conductive pattern and an empty space below the second conductive pattern.

3. The method of claim 2, further comprising after performing the dry blanket etch to form the spacers:

forming a second insulation layer; and selectively etching the second insulation layer to form a fuse box exposing the second conductive pattern.

4. The method of claim 1, wherein the first conductive pattern comprises a lower metal line, and the second conductive pattern comprises an upper metal line.

5. The method of claim 1, wherein the first insulation pattern comprises a nitride-based layer and the inter-layer insulation layer comprises an oxide-based layer.

6. The method of claim 1, wherein removing remaining portions of the inter-layer insulation layer comprises performing a wet dip process.

7. The method of claim 2, wherein the first insulation pattern and the spacers comprise a nitride-based layer.

8. The method of claim 1, wherein a width of the openings along the first direction is greater than a width of the space part along the first direction.

9. The method of claim 1, wherein a width of the second conductive pattern along the first direction is greater than a width of the space part along the first direction.

10. The method of claim 1, wherein ends of the spaced apart first conductive pattern formed on both sides of the space part have two lines isolated along the second direction.

11. The method of claim 10, wherein the openings along the second direction have widths formed to expose a portion of each of the two lines, and the openings along the first direction have a width ranging between a minimum width and a maximum width of the space part along the first direction.

12. The method of claim 10, wherein a width of the second conductive pattern along the second direction is substantially the same as the width of the space part along the second direction, and a width of the second conductive pattern along the first direction ranges between a minimum width and a maximum width of the space part along the first direction.

* * * * *